United States Patent
Kumakura et al.

(10) Patent No.: US 11,094,550 B2
(45) Date of Patent: Aug. 17, 2021

(54) ETCHING METHOD AND ETCHING APPARATUS

(71) Applicant: TOKYO ELECTRON LIMITED, Tokyo (JP)

(72) Inventors: Sho Kumakura, Miyagi (JP); Ryutaro Suda, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/744,800

(22) Filed: Jan. 16, 2020

(65) Prior Publication Data
US 2020/0234963 A1   Jul. 23, 2020

(30) Foreign Application Priority Data

Jan. 17, 2019  (JP) .............................. JP2019-006032

(51) Int. Cl.
| | |
|---|---|
| *H01L 21/3065* | (2006.01) |
| *H01L 21/311* | (2006.01) |
| *H01J 37/32* | (2006.01) |
| *H01L 21/3213* | (2006.01) |
| *H01L 21/683* | (2006.01) |
| *H01L 21/67* | (2006.01) |

(52) U.S. Cl.
CPC .... *H01L 21/3065* (2013.01); *H01J 37/32091* (2013.01); *H01J 37/32165* (2013.01); *H01L 21/31116* (2013.01); *H01L 21/32137* (2013.01); *H01L 21/67103* (2013.01); *H01L 21/6831* (2013.01)

(58) Field of Classification Search
None
See application file for complete search history.

(56) References Cited

U.S. PATENT DOCUMENTS

| | | | | |
|---|---|---|---|---|
| 6,692,648 | B2 * | 2/2004 | Hwang | ............... C23C 16/46 216/55 |
| 8,361,873 | B2 * | 1/2013 | Ohnuma | ............ H01L 27/1266 438/311 |
| 2003/0091739 | A1 * | 5/2003 | Sakamoto | ............... C23C 16/56 427/248.1 |
| 2005/0067101 | A1 * | 3/2005 | Funabashi | ......... H01L 21/67109 156/345.18 |
| 2016/0196969 | A1 * | 7/2016 | Berry, III | ............ H01L 21/0274 438/694 |

FOREIGN PATENT DOCUMENTS

JP         2017-011255 A       1/2017

OTHER PUBLICATIONS

S. Altmannshofer et al; IOP conference series; Material Science Eng.213 012021 (Year: 2017).*

* cited by examiner

*Primary Examiner* — Shamim Ahmed
(74) *Attorney, Agent, or Firm* — Rothwell, Figg, Ernst & Manbeck, P.C.

(57) ABSTRACT

An etching method include: etching a silicon-containing film or a metal-containing film formed on a substrate; and heating the substrate by temporarily irradiating the substrate with electromagnetic waves during the etching.

16 Claims, 6 Drawing Sheets

ETCHING METHOD AND ETCHING APPARATUS

CROSS-REFERENCE TO RELATED APPLICATIONS

This application is based on and claims priority from Japanese Patent Application No. 2019-006032, filed on Jan. 17, 2019 with the Japan Patent Office, the disclosure of which is incorporated herein in its entirety by reference.

TECHNICAL FIELD

The present disclosure relates to an etching method and an etching apparatus.

BACKGROUND

Japanese Patent Laid-Open Publication No. 2017-011255 discloses a technology of controlling the temperature of a substrate surface at less than −35° C., generating plasma from a hydrogen-containing gas and a fluorine-containing gas, and etching a silicon oxide film by the plasma.

SUMMARY

An etching method according to an aspect of the present disclosure includes: etching a silicon-containing film or a metal-containing film formed on a substrate; and heating the substrate by temporarily irradiating the substrate with electromagnetic waves during the etching.

The foregoing summary is illustrative only and is not intended to be in any way limiting. In addition to the illustrative aspects, embodiments, and features described above, further aspects, embodiments, and features will become apparent by reference to the accompanying drawings and the following detailed description.

DETAILED DESCRIPTION

In the following detailed description, reference is made to the accompanying drawings, which form a part thereof. The illustrative embodiments described in the detailed description, drawings, and claims are not meant to be limiting. Other embodiments may be utilized, and other changes may be made without departing from the spirit or scope of the subject matter presented here.

Hereinafter, an etching method and an etching apparatus according to an embodiment of the present disclosure will be described in detail with reference to drawings. The etching method and the etching apparatus according to the present disclosure are not limited by the embodiment.

Meanwhile, when a substrate on which a silicon-containing film or a metal-containing film is formed is etched, in some cases, a by-product is generated on the substrate, and an etching failure such as etching shape deterioration or etching stop occurs due to the influence of the by-product. Therefore, a technique of suppressing an etching failure from occurring due to the influence of a by-product is expected.

[Configuration of Etching Apparatus]

Figure 1:
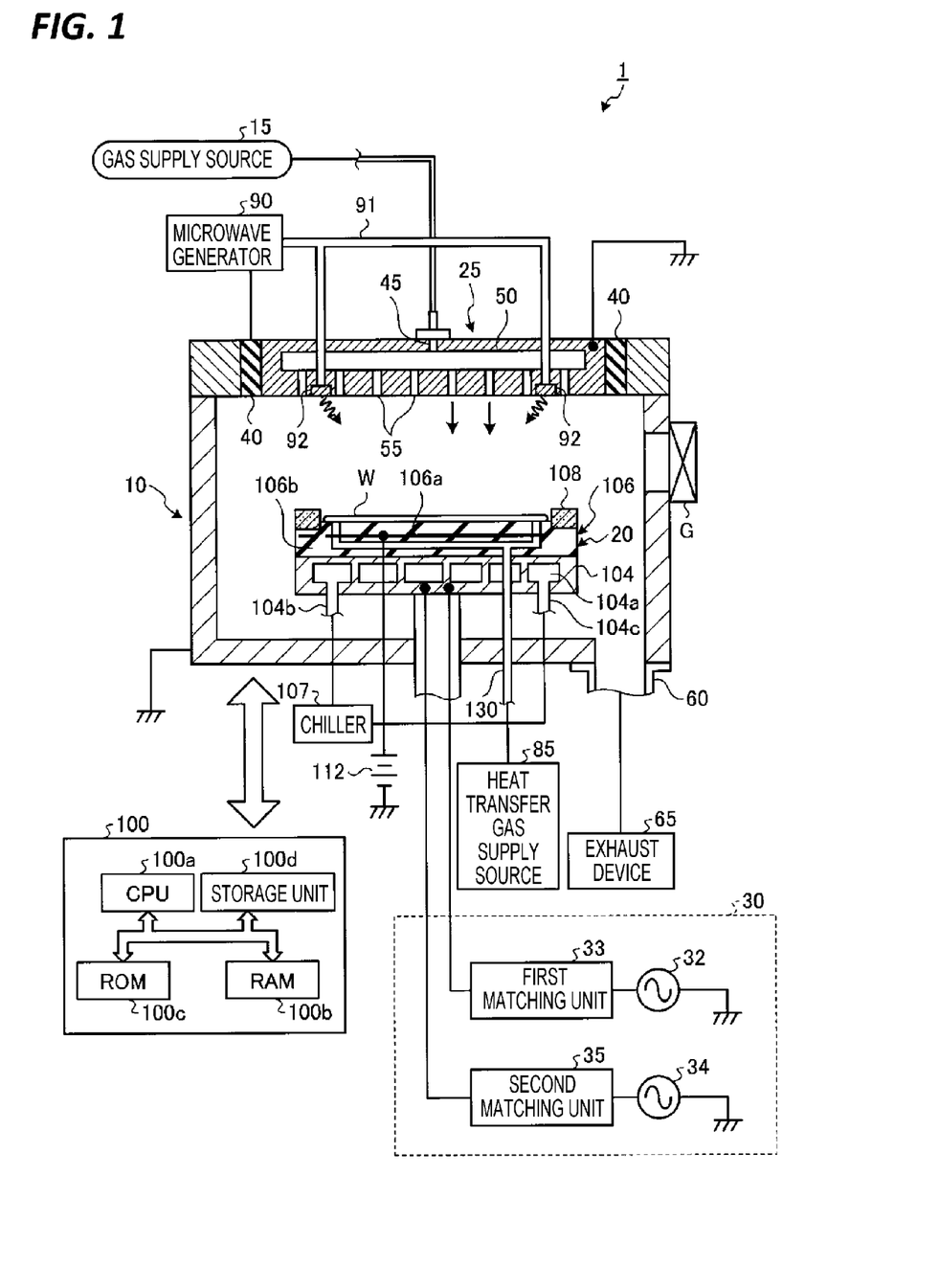
FIG. 1 is a view illustrating an example of a schematic configuration of an etching apparatus according to an embodiment.

An example of a configuration of the etching apparatus according to the embodiment will be described. FIG. 1 is a view illustrating an example of a schematic configuration of the etching apparatus according to the embodiment. In the embodiment, a case where an etching apparatus 1 is a capacitively coupled parallel plate-type plasma processing apparatus will be described as an example. A placing table 20 to be described below also functions as a lower electrode. A gas shower head 25 also functions as an upper electrode.

The etching apparatus 1 has a cylindrical chamber 10 made of, for example, aluminum whose surface has been subjected to alumite treatment (anodizing treatment). The chamber 10 is electrically grounded. The placing table 20 is provided inside the chamber 10. The placing table 20 is provided at the lower portion of the chamber 10, and a semiconductor wafer (hereinafter, simply referred to as a "wafer W") is placed on the placing table 20. The wafer W is an example of a substrate. The placing table 20 is molded into a cylindrical shape by, for example, aluminum (Al), titanium (Ti), or silicon carbide (SiC). An electrostatic chuck 106 that electrostatically attracts the wafer is provided on the top surface of the placing table 20. The electrostatic chuck 106 has a structure in which a chuck electrode 106a is interposed between insulators 106b. A DC voltage source 112 is connected to the chuck electrode 106a. The chuck electrode 106a attracts the wafer W by a Coulomb force that occurs when a DC voltage HV is applied from the DC voltage source 112 to the chuck electrode 106a.

A focus ring 108 is disposed at the peripheral portion of the electrostatic chuck 106 to surround the periphery of the placing table 20. The focus ring 108 is made of, for example, silicon or quartz. The focus ring 108 functions to increase the in-plane uniformity of etching.

The placing table 20 is supported by a support 104. A coolant flow path 104a is formed inside the support 104. A coolant inlet pipe 104b and a coolant outlet pipe 104c are connected to the coolant flow path 104a. The coolant inlet pipe 104b and the coolant outlet pipe 104c are connected to a chiller 107. The chiller 107 outputs a cooling medium (hereinafter, also called a "coolant") such as, for example, cooling water or brine, to the coolant inlet pipe 104b. The coolant output from the chiller 107 returns to the chiller 107 through the coolant inlet pipe 104b, the coolant flow path 104a, and the coolant outlet pipe 104c. The chiller 107 circulates the coolant through the coolant inlet pipe 104b, the coolant flow path 104a, and the coolant outlet pipe 104c. Due to heat-releasing by the coolant, the placing table 20, the electrostatic chuck 106, and the wafer W are cooled to a temperature approximately equal to the temperature of the coolant.

A gas supply line 130 is provided for the placing table 20 and the electrostatic chuck 106. The gas supply line 130 is connected to a heat transfer gas supply source 85. The heat transfer gas supply source 85 supplies a heat transfer gas such as, for example, a helium gas (He) or an argon gas (Ar) to the back surface of the wafer W on the electrostatic chuck 106 through the gas supply line 130. Through such a configuration, the temperature of the electrostatic chuck 106 is controlled by the coolant circulating through the coolant flow path 104a, and the heat transfer gas supplied to the back surface of the wafer W. As a result, the wafer may be controlled at a predetermined temperature. The heat transfer gas supply source 85 and the gas supply line 130 are an example of a heat transfer gas supply mechanism that supplies the heat transfer gas to the back surface of the wafer W.

A power supply device 30 that supplies a radio-frequency power having two superimposed frequencies is connected to the placing table 20. The power supply device 30 has a first radio-frequency power supply 32 that supplies a first radio-frequency power having a first frequency (a radio-frequency power for plasma generation), and a second radio-frequency power supply 34 that supplies a second radio-frequency power having a second frequency lower than the first frequency (a radio-frequency power for bias voltage generation). The first radio-frequency power supply 32 is electrically connected to the placing table 20 via a first matching unit 33. The second radio-frequency power supply 34 is electrically connected to the placing table 20 via a second matching unit 35. The first radio-frequency power supply 32 applies the first radio-frequency power at, for example, 60 MHz to the placing table 20. The second radio-frequency power supply 34 applies the second radio-frequency power at, for example, 13.56 MHz to the placing table 20. In the embodiment, the first radio-frequency power is applied to the placing table 20, but may be applied to the gas shower head 25.

The first matching unit 33 matches a load impedance to an internal (or output) impedance of the first radio-frequency power supply 32. The second matching unit 35 matches a load impedance to an internal (or output) impedance of the second radio-frequency power supply 34. The first matching unit 33 functions to make the internal impedance of the first radio-frequency power supply 32 apparently coincide with the load impedance when plasma is generated within the chamber 10. The second matching unit 35 functions to make the internal impedance of the second radio-frequency power supply 34 apparently coincide with the load impedance when plasma is generated within the chamber 10.

The gas shower head 25 is disposed above the placing table 20 while facing the placing table 20. The gas shower head 25 is provided to block an opening at a ceiling portion of the chamber 10 via a shield ring 40 covering the peripheral portion of the gas shower head 25. The gas shower head 25 may be electrically grounded as illustrated in FIG. 1. The gas shower head 25 may be connected to a variable DC power supply to apply a predetermined DC voltage.

A gas introducing port 45 that introduces a gas is formed in the gas shower head 25. A diffusion chamber 50 that communicates with the gas introducing port 45 is provided inside the gas shower head 25. The gas introducing port 45 is connected to a gas supply source 15 through a gas pipe. The gas supply source 15 supplies various gases used for a plasma processing. A gas output from the gas supply source 15 is supplied to the diffusion chamber 50 through the gas introducing port 45, diffused in the diffusion chamber 50, and then introduced from a plurality of gas supply holes 55 toward the placing table 20.

The etching apparatus 1 is provided with an irradiation unit that irradiates the wafer W with electromagnetic waves in order to heat the wafer W. In the embodiment, a case where the wafer W is heated by being irradiated with microwaves as electromagnetic waves will be described as an example. The etching apparatus 1 is provided with a microwave generator 90 and a waveguide 91, as the irradiation unit. The microwave generator 90 is disposed outside the chamber 10, for example, above the gas shower head 25. The microwave generator 90 includes, for example, a magnetron, and thus generates microwaves. The frequency of the microwaves may be, for example, 2.45 GHz or 5.85 GHz. A quartz window 92 is provided around the gas shower head 25. In the arrangement of the waveguide 91, one end is connected to the microwave generator 90, and the other end is connected to the quartz window 92 such that microwaves may radiate toward the placing table 20. The microwaves generated by the microwave generator 90 radiate toward the placing table 20 through the waveguide 91 and the quartz window 92. The wafer W placed on the placing table 20 absorbs radiating microwaves and generates heat through internal heating, and then the temperature thereof rises. In the etching apparatus 1, an antenna may be disposed within the chamber 10, for example, in the gas shower head 25 so as to oscillate microwaves from the antenna and then to irradiate the wafer W placed on the placing table 20 with the microwaves. In the etching apparatus 1, the quartz window may be provided at a central portion of the gas shower head 25 or a side wall of the chamber 10 to irradiate the wafer W with the microwaves from the central portion of the gas shower head 25 or the side wall of the chamber 10.

An exhaust port 60 is formed in a bottom surface of the chamber 10. An exhaust device 65 is connected to the exhaust port 60. The inside of the chamber 10 is exhausted by the exhaust device 65. The inside of the chamber 10 is maintained at a predetermined degree of vacuum by the exhaust device 65 during a plasma processing. A gate valve G is provided on a side wall of the chamber 10. The gate valve G opens and closes a loading/unloading port when the wafer W is loaded and unloaded to/from the chamber 10.

A controller 100 that controls the overall operations of the apparatus is provided in the etching apparatus 1. The controller 100 is, for example, a computer, and includes a central processing unit (CPU) 100a, a random access memory (RAM) 100b, a read only memory (ROM) 100c, and a storage unit 100d such as an auxiliary storage device.

The storage unit 100d stores various programs such as, for example, a control program that controls the etching apparatus 1 or a program that executes an etching processing to be described below. The storage unit 100d stores process conditions for an etching processing such as, for example, a recipe. The recipe describes, for example, a process time, a pressure (gas exhaust), a radio-frequency power or voltage, and various gas flow rates, as apparatus control information in relation to the process conditions. The recipe also describes, for example, temperatures in the chamber (e.g., an upper electrode temperature, a side wall temperature of the chamber, and a wafer W temperature (an electrostatic chuck temperature)), and a temperature of a coolant output from the chiller 107. These programs or recipes describing process conditions may be stored in a hard disk or a semiconductor memory. The recipe may be set in a predetermined location and read while being stored in a computer-readable portable storage medium such as, for example, a CD-ROM and a DVD.

In the controller 100, the CPU 100a operates on the basis of the programs stored in the storage unit 100d or the process conditions for a plasma processing to control the overall operations of the apparatus. The controller 100 may be provided inside or outside the etching apparatus 1. When the controller 100 is provided outside, the controller 100 may control the etching apparatus 1 by, for example, a wired or wireless communication unit.

Next, the flow in etching the wafer W by the etching apparatus 1 will be simply described. The etching apparatus 1 places the gate valve G in an open state. In the etching apparatus 1, the wafer W to be etched is loaded into the chamber 10 by a robot arm (not illustrated) via the gate valve G and is placed on the placing table 20. On the wafer W, a silicon-containing film has been formed as an etching target film. Examples of the silicon-containing film may include a Si film, a $SiO_2$ film, a SiN film, a SIC film, and a low dielectric constant material film (Low-k film). After the robot arm is withdrawn, the etching apparatus 1 places the gate valve G in a close state.

The etching apparatus 1 exhausts the inside of the chamber 10 by the exhaust device 65 to a predetermined degree of vacuum suitable for etching. The etching apparatus 1 applies a DC voltage HV from the DC voltage source 112 to the chuck electrode 106a, and attracts and holds the wafer W on the electrostatic chuck 106 by a Coulomb force.

The etching apparatus 1 starts an etching processing of the wafer W. For example, the etching apparatus 1 cools the placing table 20, the electrostatic chuck 106, and the wafer W to a low temperature by circulating a cooled coolant from the chiller 107 through the coolant inlet pipe 104b, the coolant flow path 104a, and the coolant outlet pipe 104c. For example, the etching apparatus 1 cools the wafer W to −30° C. or less by circulating a coolant cooled to −30° C. or less. Then, the etching apparatus 1 supplies an etching gas from the gas supply source 15, and supplies the etching gas from the gas shower head 25 into the chamber 10. The etching apparatus 1 applies a power having two superimposed frequencies from the power supply device 30 to the placing table 20. For example, the etching apparatus 1 applies a first radio-frequency power from the first radio-frequency power supply 32 to the placing table 20. Also, the etching apparatus 1 applies a second radio-frequency power from the second radio-frequency power supply 34 to the placing table 20. Accordingly, in the etching apparatus 1, plasma is generated within the chamber 10, and the silicon-containing film on the wafer W is etched by the generated plasma.

After the etching processing, the etching apparatus 1 applies a DC voltage HV having a polarity opposite to that at the attraction of the wafer W from the DC voltage source 112 to the chuck electrode 106a, eliminates electric charges from the wafer W, and separates the wafer W from the electrostatic chuck 106. The etching apparatus 1 places the gate valve G in an open state. In the etching apparatus 1, the robot arm (not illustrated) enters the chamber 10 via the gate valve G, and the wafer W on the placing table 20 is unloaded from the placing table 20. After the robot arm is withdrawn, the etching apparatus 1 places the gate valve G in a close state.

The etching apparatus 1 may etch the silicon-containing film at a high etching rate by performing etching while cooling the wafer W to a low temperature, as compared to that in a case where the wafer W is etched at room temperature.

Figure 2:
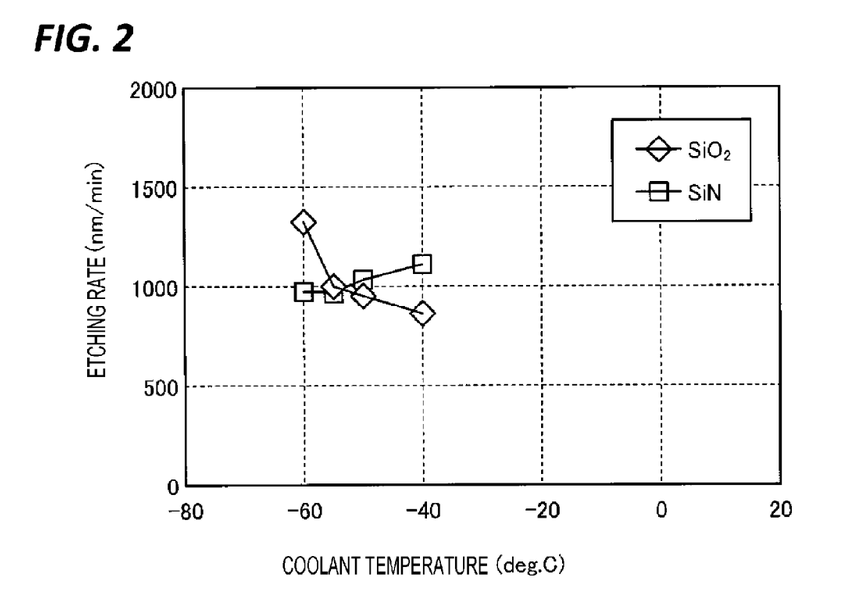
FIG. 2 is a view illustrating examples of etching rates of silicon-containing films according to the embodiment.

FIG. 2 is a view illustrating examples of etching rates of silicon-containing films according to the embodiment. FIG. 2 illustrates etching rates when a coolant temperature ranges from −40° C. to −60° C., a $CF_2$ gas and a $H_2$ gas are supplied as etching gases, and a $SiO_2$ film and a SiN film are etched. The wafer W is cooled to a temperature ranging from −40° C. to −60° C., which is approximately the same as the coolant temperature. FIG. 2 illustrates a case where the coolant temperature ranges from −40° C. to −60° C. However, this is an example, and the coolant temperature is not limited thereto. When etching the silicon-containing film such as, for example, a Si film, a $SiO_2$ film, and a SiN film, the etching apparatus 1 may etch the silicon-containing film at a high etching rate by performing etching while cooling the wafer W to a temperature of −30° C. or less.

However, when the etching apparatus 1 etches a wafer W, in some cases, a by-product is generated on the wafer W, and an etching failure such as etching shape deterioration or etching stop occurs due to the influence of the by-product. For example, when the etching apparatus 1 etches a $SiO_2$ film or a SiN film, $(NH_4)_2SiF_6$ (ammonium fluorosilicate) is generated as a by-product on the wafer W. Hereinafter, $(NH_4)_2SiF_6$ is also referred to as "AFS." When the temperature of the wafer W is a low temperature (for example, −30° C. or less), in some cases, the by-product remains on the wafer W due to a decrease of volatility, thereby causing an etching failure such as etching shape deterioration or etching stop.

Figure 3:
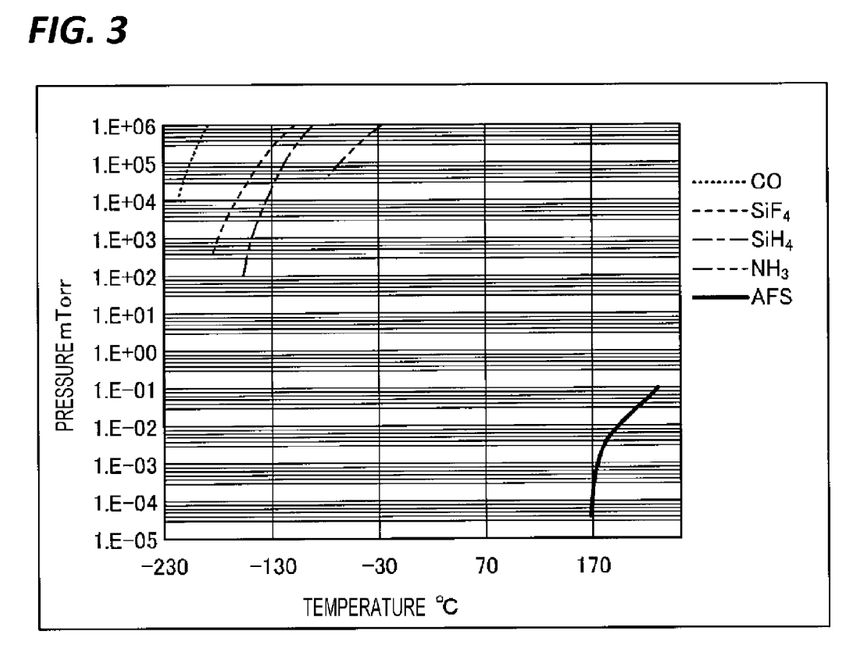
FIG. 3 is a view illustrating examples of vapor pressure curves according to the embodiment.

FIG. 3 is a view illustrating examples of vapor pressure curves according to the embodiment. FIG. 3 illustrates vapor pressure curves of main substances generated when a $SiO_2$ film or a SiN film is etched. For example, when the $SiO_2$ film or the SiN film is etched, AFS is generated as a by-product. Further, CO, $SiF_4$, $SiH_4$, and $NH_3$ are generated.

CO, $SiF_4$, $SiH_4$, and $NH_3$ have low saturated vapor pressure temperatures, and thus volatilize even at a low temperature (for example, −30° C.). A silicon-containing film such as a Si film, a $SiO_2$ film or a SiN film is mainly changed into a $SiH_4$ gas and then volatilize during etching. However, when the temperature of a wafer W is too low, $SiH_4$ does not volatilize. For example, when the temperature of the wafer W is equal to or lower than the saturated vapor pressure temperature of $SiH_4$ with respect to the pressure within the chamber 10 during etching, $SiH_4$ does not volatilize. Therefore, there is a lower limit for the wafer W temperature at which etching is executable. For example, when the silicon-containing film is etched, a lower limit temperature of the wafer W is the saturated vapor pressure temperature of $SiH_4$ with respect to the pressure within the chamber 10. The etching apparatus 1 needs to control the temperature of the wafer W to a temperature higher than the lower limit temperature. When etching the silicon-containing film, the etching apparatus 1 according to the embodiment cools the wafer W to a temperature ranging from, for example, −30° C. to −60° C. (temperature control).

Meanwhile, AFS has a high saturated vapor pressure temperature, and thus remains as a by-product on the wafer W without volatilizing at a low temperature (for example, −30° C.).

Therefore, the etching apparatus 1 heats the wafer W by temporarily irradiating the wafer W with microwaves during etching. For example, the etching apparatus 1 heats the wafer W by irradiating the wafer W with microwaves in pulses for, for example, about several seconds. Due to heating of the wafer W, the by-product remaining on the wafer W is volatilized and removed. Thus, it is possible to suppress an etching failure from occurring due to the influence of the by-product.

Figure 4:
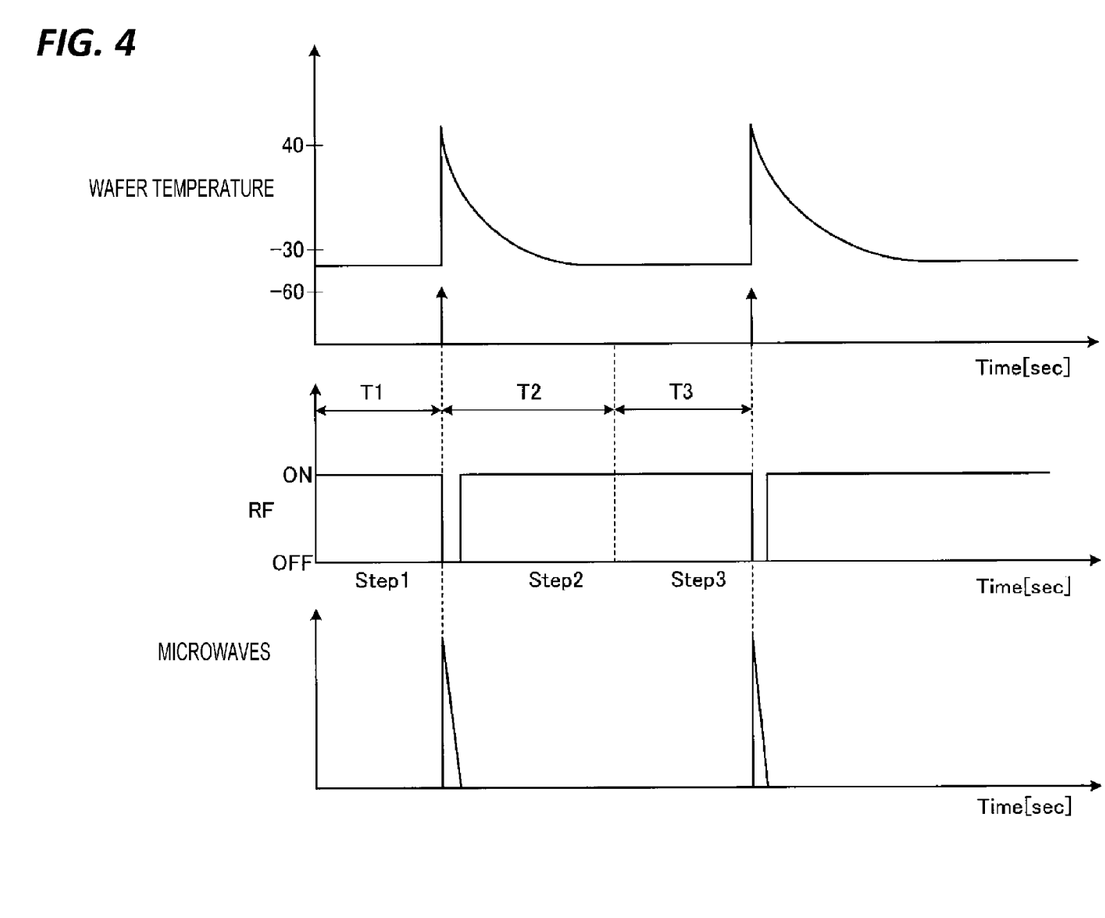
FIG. 4 is a timing chart illustrating the flow of an etching processing according to the embodiment.
Figures 5A, 5B:
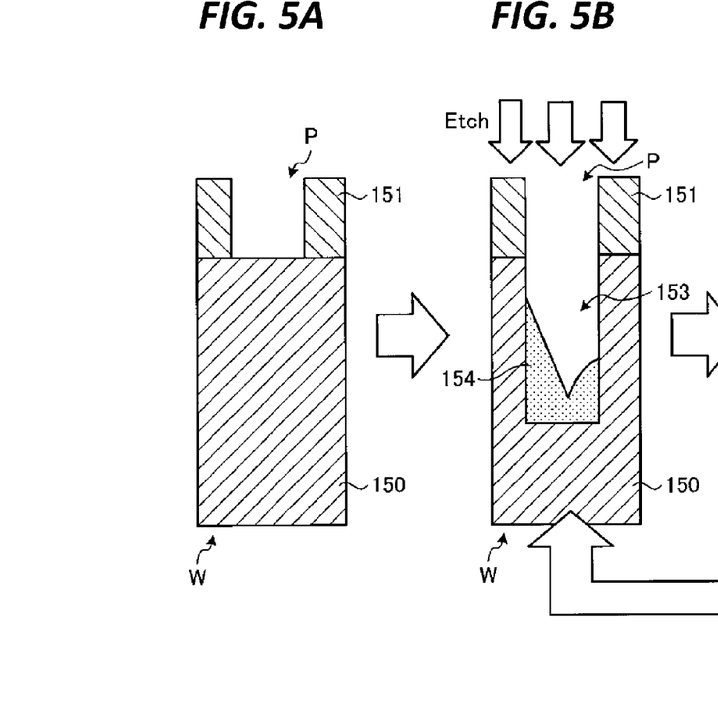
FIGS. 5A to 5D are views schematically illustrating states of a wafer during the etching processing according to the embodiment.

FIG. 4 is a timing chart illustrating the flow of an etching processing according to the embodiment. FIGS. 5A to 5D are views schematically illustrating states of a wafer during the etching processing according to the embodiment. As illustrated in FIG. 5A, on the wafer W, a silicon oxide film 150 is formed as an etching target film, and a mask film 151 is provided on the silicon oxide film 150. The silicon oxide film 150 is, for example, a Si film, a $SiO_2$ film, or a SiN film. The silicon oxide film 150 may be a stacked film in which the Si film, the $SiO_2$ film, and the SiN film are stacked. For example, the silicon oxide film 150 may be a stacked film in which the $SiO_2$ film and the SiN film are stacked. As for the mask film 151, for example, a polysilicon film, an organic film, an amorphous carbon film, or a titanium nitride (TiN) film may be used. A pattern P that reaches the silicon oxide film 150 is formed in the mask film 151.

The etching apparatus 1 cools the wafer W to a temperature ranging from −30° C. to −60° C. by circulating a cooled coolant. Then, the etching apparatus 1 generates plasma within the chamber 10 and performs etching by applying a radio-frequency power having two superimposed frequencies from the power supply device 30 to the placing table 20 while supplying an etching gas from the gas supply source 15 into the chamber 10. FIG. 4 illustrates temperatures of the wafer W during the etching processing. FIG. 4 further illustrates a period during which the radio-frequency power (RF) having two superimposed frequencies is applied from the power supply device 30. The period during which the radio-frequency power (RF) having two frequencies is applied corresponds to a period during which plasma is generated. FIG. 4 further illustrates an irradiation period during which irradiation of microwaves is performed. FIG. 5B illustrates a state of the wafer W in the period T1 in FIG. 4. In the wafer W, the silicon oxide film 150 is etched along the pattern P of the mask film 151, and thus a recess 153 is formed in the silicon oxide film 150. However, a by-product such as AFS is generated due to the etching and thus a by-product 154 remains on the recess 153.

Figure 5C:
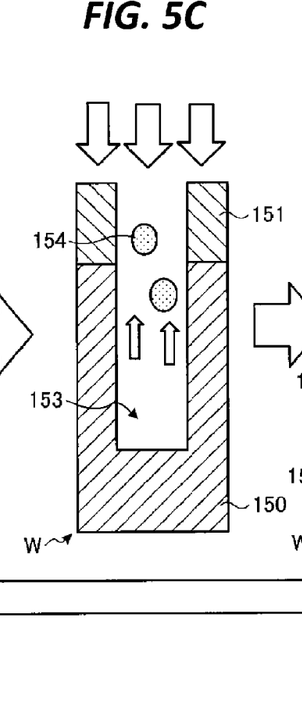

The etching apparatus 1 heats the wafer W by temporarily irradiating the wafer W with microwaves during the etching. In the period T2 in FIG. 4, the wafer W is initially irradiated with the microwaves in pulses. Due to the irradiation of the microwaves, the temperature of the wafer W rapidly rises. FIG. 5C illustrates a state of the wafer W in the period T2 in FIG. 4. In the wafer W, as the temperature rises, the by-product 154 is sublimated, and is removed from the recess 153. When the irradiation of the microwaves is stopped, the temperature of the wafer W is lowered due to cooling from the placing table 20. Here, in some cases, a plasma state may be disturbed due to the influence of the microwaves. Therefore, the etching apparatus 1 according to the embodiment temporarily causes plasma to disappear by stopping application of the radio-frequency power (RF) having two frequencies during the irradiation period of the microwaves. Accordingly, it is possible to suppress the plasma state from being disturbed due to the influence of the microwaves, and affecting the etching. The etching apparatus 1 may continue to perform the etching by continuing application of the radio-frequency power (RF) even in the period during which the irradiation of the microwaves is performed. Accordingly, a period for etching may be prolonged.

Figure 5D:
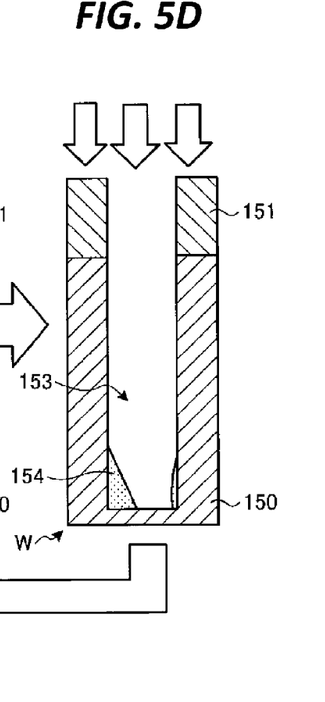

After the irradiation of the microwaves is stopped, the etching apparatus 1 generates plasma within the chamber 10 and performs etching by resuming application of the radio-frequency power (RF) having two frequencies. FIG. 5D illustrates a state of the wafer W in the period T3 in FIG. 4. In the wafer W, the recess 153 is more deeply etched. However, a by-product such as AFS is generated due to the etching and thus the by-product 154 remains on the recess 153. The etching apparatus 1 periodically repeats heating the wafer W by temporarily irradiating the wafer W with microwaves during etching, as in the period T2 in FIG. 4. Accordingly, during the etching, the by-product 154 is periodically sublimated and is removed, and thus an etching failure such as etching shape deterioration or etching stop is suppressed from occurring due to the influence of the by-product.

As described above, the etching apparatus 1 periodically repeats heating the wafer W and sublimating the by-product 154 through temporary irradiation of microwaves during etching, and thus may perform the etching while suppressing an etching failure from occurring due to the influence of the by-product.

Next, descriptions will be made on the temperature of the wafer W required for sublimation of a by-product. In order to sublimate the by-product remaining on the wafer W, it is necessary to heat the wafer W by microwaves to a temperature equal to or higher than a sublimation temperature of the by-product. However, for the wafer W, heat is also input from plasma. Thus, the etching apparatus 1 does not need to heat the wafer W by just the microwaves to the sublimation temperature of the by-product. For example, when the by-product is AFS, the etching apparatus 1 may remove most of the by-product made of AFS as long as the temperature of the wafer W may be raised by 40° C. or more by the microwaves as compared to that during, for example, etching illustrated in the period T1 in FIG. 4.

Next, as an example, an example of energy required for raising the temperature of the wafer W will be described. The wafer W is a silicon wafer, and has a weight of 125 g, and a specific heat of 0.71 J/g. In this case, for example, when the temperature of the wafer W is raised by 100° C., a required heat quantity Q is obtained by the following equation (1).

$$Q=0.71\times125\times100=8875 \text{ J} \qquad (1)$$

Microwaves penetrate to a depth of about 100 μm from the outer portion of the wafer W. When the thickness of the wafer W is 775 μm, in a case where the vicinity of the surface of the wafer W (for example, 100 μm from the outer portion of the wafer W) is raised by 100° C., a required heat quantity Q' is obtained by the following equation (2).

$$Q'=8875\times(100/775)=1155 \text{ J} \qquad (2)$$

Therefore, for example, when only the vicinity of the surface of the wafer W is raised by 100° C., the microwaves only have to radiate for one second with input power of 1115 W.

Figure 6:
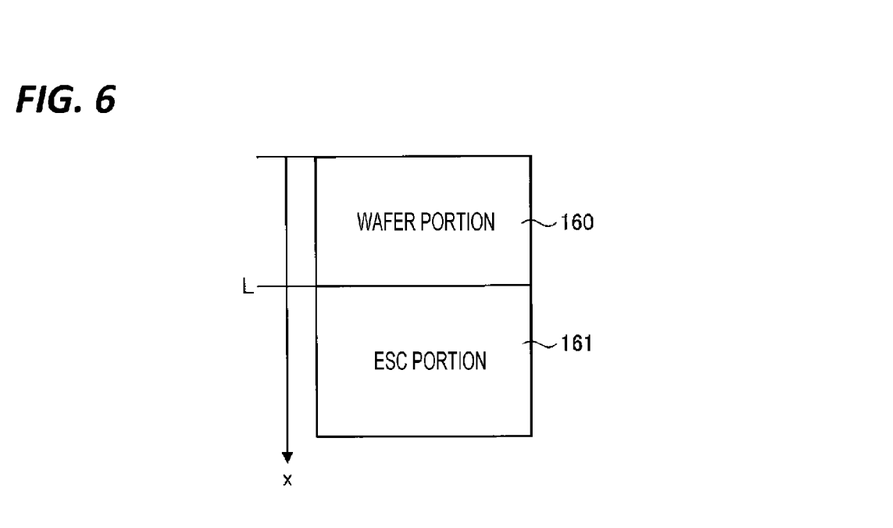
FIG. 6 is a view schematically illustrating an example of a calculation model used for calculating a cooling time according to the embodiment.

Next, descriptions will be made on an example of a cooling time required for cooling a heated wafer W. For example, in order to obtain the temperature change of the heated wafer W, the wafer W and the electrostatic chuck 106 of the placing table 20 are modeled. FIG. 6 is a view schematically illustrating an example of a calculation model used for calculating a cooling time according to the embodiment. In the calculation model in FIG. 6, a wafer portion 160 and an ESC portion 161 are provided overlapping each other. The wafer portion 160 is a model of the wafer W. The ESC portion 161 is a model of the electrostatic chuck 106. In the calculation model, the thickness direction of the wafer portion 160 and the ESC portion 161 is the x-axis direction, and the surface of the wafer portion 160 is zero on the x-axis. The thickness of the wafer portion 160 is L. In this case, a one-dimensional heat conduction equation in the x-axis direction may be expressed as the following equation (3).

$$\rho c \frac{\partial T}{\partial t} = \alpha \frac{\partial^2 T}{\partial x^2} \quad (3)$$

Here, $\rho$ is the density of the wafer W. For example, $\rho$ is 2300 Kg/m$^3$.

$\alpha$ is the thermal conductivity of the wafer W. For example, $\alpha$ is 149 W/(m·K).

c is the unit volume heat capacity of the wafer W. For example, c is 1,600,000 J/(K·m$^3$).

$T_0$ is an initial temperature difference of the wafer W with respect to the electrostatic chuck 106. For example, when only the vicinity of the surface of the wafer W is raised by 100° C., $T_0$ is 100° C.

L is the thickness of the wafer W. For example, L is 750 µm.

When a range of 100 µm from the surface (0 µm) of the wafer portion 160 is raised by 100° C. as compared to the ESC portion 161, a boundary condition of the calculation model may be expressed as the following equation (4).

$$T(0, x = 0 \sim 100 \ \mu m) = T_0 \quad (4)$$
$$T(t, L) = 0$$
$$\left.\frac{\partial T}{\partial x}\right|_{x=0} = 0$$

Figure 7:
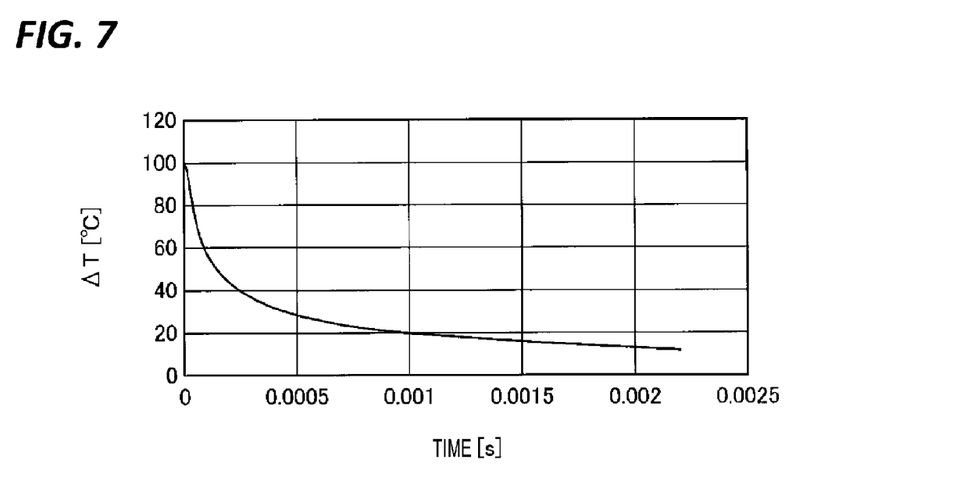
FIG. 7 is a view illustrating an example of a temperature change according to the embodiment.

A temperature change of the surface (x=0 µm) of the wafer portion 160 is obtained from the heat conduction equation in the equation (3) by using the boundary condition in the equation (4). FIG. 7 is a view illustrating an example of a temperature change according to the embodiment. FIG. 7 illustrates a temporal change of a difference (ΔT) of the surface temperature of the wafer portion 160 with respect to the temperature of the ESC portion 161. As illustrated in FIG. 7, even when the surface of the wafer portion 160 is raised by 100° C. as compared to the ESC portion 161, ΔT of the surface temperature of the wafer portion 160 rapidly decreases in the order of milliseconds. That is, when irradiation of microwaves is stopped, the wafer W is rapidly cooled by the electrostatic chuck 106.

The wafer W is cooled through releasing of heat from the electrostatic chuck 106. Thus, at irradiation of the microwaves, a temperature increase rate is low. Therefore, when heating the wafer W through irradiation of the microwaves, the etching apparatus 1 may control the supply amount of a heat transfer gas in order to obtain a predetermined substrate temperature. For example, during the irradiation period of the microwaves, the etching apparatus 1 may reduce the supply amount of the heat transfer gas to be supplied from the heat transfer gas supply source 85 to a gap between the electrostatic chuck 106 and the wafer W. When the supply amount of the heat transfer gas is reduced during the irradiation period of the microwaves, since the amount of heat released from the wafer W to the electrostatic chuck 106 is reduced, the etching apparatus 1 may rapidly raise the temperature of the wafer W by the microwaves.

Here, for example, it may be thought that the etching apparatus 1 may raise the temperature of the placing table 20 or the electrostatic chuck 106 and sublimate a by-product by heating the placing table 20 or the electrostatic chuck 106 during etching. However, there is a problem in that the placing table 20 or the electrostatic chuck 106 has a low temperature raising speed, and when the placing table 20 or the electrostatic chuck 106 is heated, it takes time to switch to a low temperature.

Meanwhile, the etching apparatus 1 according to the embodiment raises the temperature of only the wafer W by irradiating the wafer W with the microwaves, and thus may rapidly raise the temperature of the wafer W. When stopping the irradiation of the microwaves, the etching apparatus 1 cools only the wafer W. Thus, it is possible to shorten the time for switching the wafer W to a low temperature. That is, the etching apparatus 1 according to the embodiment may quickly switch the temperature of the wafer W between a high temperature and a low temperature during the etching.

In the embodiment, a case where the wafer W is irradiated with microwaves as electromagnetic waves and thus the temperature of the wafer W is raised has been described as an example, but the present disclosure is not limited thereto. The etching apparatus 1 may raise the temperature of the wafer W by irradiating the wafer W with any one of laser, radiation, infrared, ultraviolet, and visible light, as electromagnetic waves. The irradiation of the microwaves may be performed in a wide range, and then a wide area may be heated at once. The microwaves may generate heat from the inside of the wafer W, and thus, may directly heat the wafer W. The irradiation of the laser may be performed in a pin-point manner, and thus only a specific range may be heated. For this reason, for example, the etching apparatus 1 may irradiate the entire wafer W with the laser by scanning a laser light source across the wafer W. For example, in the etching apparatus 1, the placing table 20 may be rotatable in the circumferential direction and the laser light source may be disposed in a line shape above the placing table 20. Then, the etching apparatus 1 may rotate the placing table 20 in the circumferential direction while performing irradiation of the laser light from the laser light source so that the entire wafer W is irradiated with the laser. The irradiation of the infrared, the ultraviolet, and the visible light may be performed in a wide range, and thus a wide area may be heated at once. The infrared may generate heat on the surface of the wafer W.

Figure 8:
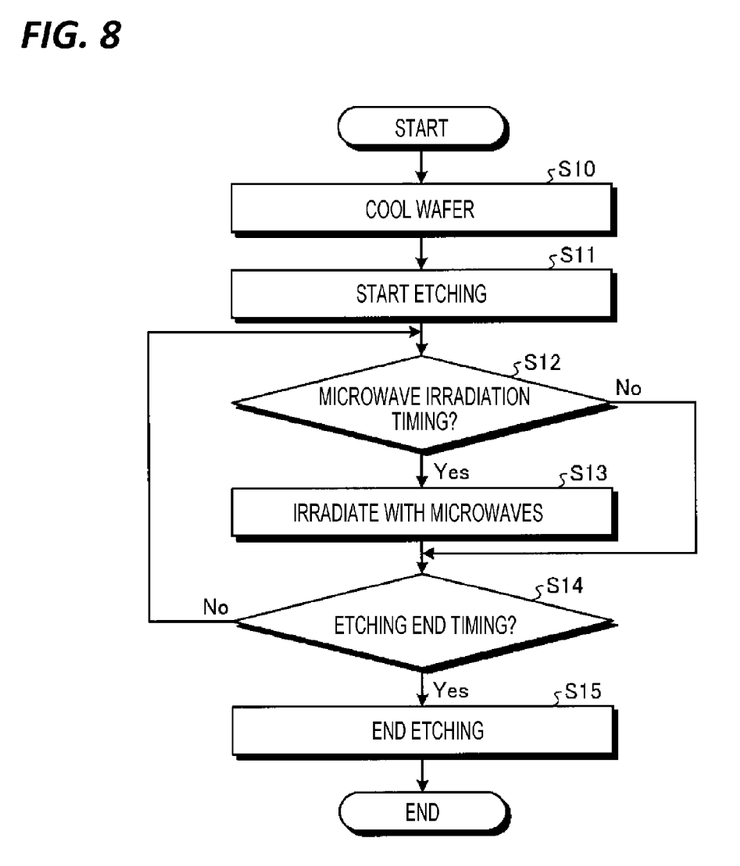
FIG. 8 is a flow chart illustrating an example of the flow of the etching processing according to the embodiment.

Next, the flow of the etching processing according to the embodiment will be simply described. FIG. 8 is a flow chart illustrating an example of the flow of the etching processing according to the embodiment.

The controller 100 cools the placing table 20, the electrostatic chuck 106, and the wafer W to a temperature ranging from −30° C. to −60° C. by circulating a cooled coolant from the chiller 107 through the coolant inlet pipe 104b, the coolant flow path 104a, and the coolant outlet pipe 104c (step S10).

The controller 100 generates plasma within the chamber 10 and starts etching by applying a radio-frequency power having two superimposed frequencies from the power supply device 30 to the placing table 20 while supplying an etching gas from the gas supply source 15 into the chamber 10 (step S11).

The controller 100 determines whether it is an irradiation timing for microwaves (step S12). For example, when the irradiation timing is set as a timing at every fixed period interval, the controller 100 determines that it is an irradiation timing at every fixed period interval during the etching. When it is not an irradiation timing (step S12, No), the process proceeds to step S14 to be described below.

Meanwhile, when it is an irradiation timing (step S12, Yes), the controller 100 irradiates the wafer W with the microwaves and heats the wafer W by outputting the microwaves from the microwave generator 90 in pulses (step S13). In the wafer W, as the temperature rises, a by-product is sublimated and removed. During the irradiation period of the microwaves, the controller 100 may stop the output of the radio-frequency power having two superimposed frequencies from the power supply device 30. When heating the wafer W through irradiation of the microwaves, the controller 100 may control the supply amount of a heat transfer gas in order to obtain a predetermined substrate temperature. For example, during the irradiation period of the microwaves, the controller 100 may reduce the amount of the heat transfer gas to be supplied from the heat transfer gas supply source 85.

When the irradiation of the microwaves is ended, the wafer W is cooled to a temperature ranging from −30° C. to −60° C. through heat-releasing from the electrostatic chuck 106.

The controller 100 determines whether it is an etching end timing (step S14). For example, when the etching has been performed for a predetermined period, it is determined that it is an etching end timing. When it is not an etching end timing (step S14, No), the process proceeds to the above described step S12.

Meanwhile, when it is an etching end timing (step S14, Yes), the controller 100 ends the process by stopping the supply of the etching gas from the gas supply source 15, and stopping the supply of the radio-frequency power having two frequencies from the power supply device 30 (step S15).

As described above, in the etching processing according to the embodiment, a silicon-containing film formed on a substrate (wafer W) is etched. In the etching processing, during etching, the substrate is temporarily irradiated with electromagnetic waves and thus is heated. Accordingly, in the etching processing according to the embodiment, it is possible to suppress an etching failure from occurring due to the influence of a by-product.

In the etching processing according to the embodiment, the substrate is etched while the temperature of the substrate is controlled to a temperature lower than a sublimation temperature at which the by-product generated on the substrate due to the etching is sublimated. Then, in the etching processing, during the etching, the substrate is temporarily irradiated with the electromagnetic waves and thus is heated to a temperature higher than the sublimation temperature. Accordingly, in the etching processing according to the embodiment, since the by-product may be sublimated and removed during the etching, it is possible to suppress the etching failure from occurring due to the influence of the by-product.

In the etching processing according to the embodiment, plasma is generated by applying a radio-frequency power (RF) so as to etch the silicon-containing film. Then, in the etching processing, during an irradiation period of the electromagnetic waves for heating the substrate, the application of the radio-frequency power is stopped. Accordingly, in the etching processing according to the embodiment, it is possible to suppress a plasma state from being disturbed.

On the substrate, the silicon-containing film is formed. In the etching processing according to the embodiment, the substrate is cooled to −30° C. or less while being etched. Then, in the etching processing, during the etching, the temperature of the substrate is temporarily raised by 40° C. or more as compared to that during the etching step. Accordingly, in the etching processing according to the embodiment, it is possible to sublimate AFS generated as the by-product during the etching.

In the etching processing according to the embodiment, the substrate is heated by being irradiated with any one of microwaves, laser, radiation, infrared, ultraviolet, and visible light as the electromagnetic waves. Accordingly, in the etching processing according to the embodiment, only the substrate may be efficiently heated.

The substrate is placed on the placing table 20, and a heat transfer gas is supplied to a gap between the placing table 20 and the substrate. In the etching processing according to the embodiment, when the substrate is heated, the supply amount of the heat transfer gas is controlled in order to obtain a predetermined substrate temperature. Accordingly, in the etching processing according to the embodiment, the temperature of the substrate may be rapidly raised by heating.

In the etching processing according to the embodiment, during the etching, heating the substrate through temporary irradiation of the electromagnetic waves is periodically repeated. Accordingly, in the etching processing according to the embodiment, even when the period for the etching processing is prolonged, the by-product may be periodically sublimated and removed. Thus, it is possible to suppress the etching failure from occurring due to the influence of the by-product.

For example, in the embodiment, a case where a processing target substrate is a semiconductor wafer has been described as an example, but the present disclosure is not limited thereto. The processing target substrate may be other substrates such as a glass substrate.

In the embodiment, a case where the substrate is periodically irradiated with electromagnetic waves and thus is heated during etching has been described as an example, but the present disclosure is not limited thereto. For example, a $SiH_4$ gas is generated due to etching of a $SiO_2$ film or a SiN film, and the amount of the $SiH_4$ gas is reduced when the etching is hindered by a by-product. Accordingly, during the etching, emission color of plasma is changed. Therefore, in the etching apparatus 1, a detection unit, such as an optical sensor, that detects plasma emission may be provided so that a timing of heating the substrate by irradiating the substrate with the electromagnetic waves may be detected from a color change of the plasma detected by the detection unit.

In the embodiment, a case where a silicon-containing film formed on the substrate is etched has been described as an example, but the present disclosure is not limited thereto. For example, the present disclosure may be applicable to a case where a metal-containing film formed on the substrate is etched. For example, in a semiconductor, the metal-containing film made of a high dielectric constant material (high-k material) is formed as a gate insulating film. Examples of the high dielectric constant material may include HfSiO (hafnium silicate), HfAlON (nitrogen-added hafnium aluminate), $HfO_2$, and $Y_2O_3$. The etching rate of such a metal-containing film is improved as the temperature is lowered. For example, when the substrate is etched while being cooled to 60° C. or less (temperature control), the etching rate of the metal-containing film is improved as compared to that in a case where the substrate is etched at a temperature higher than 60° C. However, when such a metal-containing film is etched, in some cases, a by-product is generated, and an etching failure such as etching shape deterioration or etching stop occurs due to the influence of the by-product. The by-product generated when the metal-containing film is etched is sublimated at, for example, 200° C. or more. Therefore, during etching in which the metal-containing film formed on the substrate is etched, the substrate is heated by being temporarily irradiated with electromagnetic waves. Here, for the substrate, heat is also input from plasma. Thus, the etching apparatus 1 does not need to heat the substrate by just the electromagnetic waves to the sublimation temperature of the by-product. For example, when etching the metal-containing film formed on the wafer W, the etching apparatus 1 cools the wafer W to, for example, 60° C. or less (temperature control). Then, the etching apparatus 1 heats the wafer W by temporarily irradiating the wafer W with microwaves during the etching. For example, the etching apparatus 1 irradiates the wafer W with the microwaves in pulses, for example, for about several seconds, so as to raise the temperature of the wafer W by 200° C. or more as compared to that during the etching. Even when the metal-containing film is etched, the by-product may be sublimated and removed during the etching by heating the wafer W. Thus, it is possible to suppress an etching failure from occurring due to the influence of the by-product.

In the embodiment, a case where the etching apparatus 1 is a capacitively coupled parallel plate-type plasma processing apparatus has been described as an example, but the present disclosure is not limited thereto. The etching apparatus 1 may be any type of plasma processing apparatus. For example, the etching apparatus 1 may be an inductively coupled plasma (ICP)-type plasma processing apparatus, or a plasma processing apparatus using a radial line slot antenna. The etching apparatus 1 may be a helicon wave excitation-type plasma (HWP) apparatus, or an electron cyclotron resonance plasma (ECR) apparatus.

According to the present disclosure, it is possible to suppress an etching failure from occurring due to an influence of a by-product.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. An etching method comprising:
   etching a silicon-containing film or a metal-containing film formed on a substrate; and
   heating the substrate by temporarily irradiating the substrate with electromagnetic waves during the etching,
   wherein the heating the substrate using the electromagnetic waves is periodically repeated during the etching.

2. The etching method according to claim 1, wherein the etching is performed while a temperature of the substrate is controlled to be lower than a sublimation temperature at which a by-product generated on the substrate due to the etching is sublimated, and
   the substrate is heated in the heating to a temperature higher than the sublimation temperature.

3. The etching method according to claim 2, wherein, in the etching, plasma is generated by applying a radio-frequency power so as to etch the silicon-containing film or the metal-containing film, and an application of the radio-frequency power is stopped during an irradiation period of the electromagnetic waves in the heating.

4. The etching method according to claim 2, wherein, in the etching, plasma is generated by applying a radio-frequency power so as to etch the silicon-containing film or the metal-containing film, and an application of the radio-frequency power is continued even during an irradiation period of the electromagnetic waves in the heating.

5. The etching method according to claim 4, wherein the substrate is formed with the silicon-containing film,
   in the etching, the substrate is etched while being cooled to −30° C. or less, and
   in the heating, a temperature of the substrate is raised by 40° C. or more as compared to a temperature during the etching.

6. The etching method according to claim 4, wherein the substrate is formed with the metal-containing film,
   in the etching, the substrate is etched while being cooled to 60° C. or less, and
   in the heating, a temperature of the substrate is raised by 200° C. or more as compared to a temperature during the etching.

7. The etching method according to claim 6, wherein in the heating, the substrate is heated by an irradiation with any one of microwaves, laser, radiation, infrared, ultraviolet, and visible light as the electromagnetic waves.

8. The etching method according to claim 7, wherein the substrate is placed on a stage, and a heat transfer gas is supplied to a gap between the stage and the substrate, and
   in the heating, a supply amount of the heat transfer gas is controlled to reach a predetermined substrate temperature when the substrate is heated.

9. The etching method according to claim 1, wherein, in the etching, plasma is generated by applying a radio-frequency power so as to etch the silicon-containing film or the metal-containing film, and an application of the radio-frequency power is stopped during an irradiation period of the electromagnetic waves in the heating.

10. The etching method according to claim 1, wherein, in the etching, plasma is generated by applying a radio-frequency power so as to etch the silicon-containing film or the metal-containing film, and an application of the radio-frequency power is continued during an irradiation period of the electromagnetic waves in the heating.

11. The etching method according to claim 1, wherein the substrate is formed with the silicon-containing film,
   in the etching, the substrate is etched while being cooled to −30° C. or less, and
   in the heating, a temperature of the substrate is raised by 40° C. or more as compared to a temperature during the etching.

12. The etching method according to claim 1, wherein the substrate is formed with the metal-containing film,
   in the etching, the substrate is etched while being cooled to 60° C. or less, and
   in the heating, a temperature of the substrate is raised by 200° C. or more as compared to a temperature during the etching.

13. The etching method according to claim 1, wherein in the heating, the substrate is heated by an irradiation with any one of microwaves, laser, radiation, infrared, ultraviolet, and visible light as the electromagnetic waves.

14. The etching method according to claim 1, wherein the substrate is placed on a stage, and a heat transfer gas is supplied to a gap between the stage and the substrate, and
   in the heating, a supply amount of the heat transfer gas is controlled to reach a predetermined substrate temperature when the substrate is heated.

15. An etching method comprising:
   etching a silicon-containing film or a metal-containing film formed on a substrate; and
   heating the substrate by temporarily irradiating the substrate with electromagnetic waves during the etching, wherein the etching is performed while a temperature of the substrate is controlled to be lower than a sublimation temperature at which a by-product generated on the substrate due to the etching is sublimated, the substrate is heated in the heating to a temperature higher than the sublimation temperature, and in the etching, plasma is generated by applying a radio-frequency power so as to etch the silicon-containing film or the metal-containing film, and an application of the radio-frequency power is stopped during an irradiation period of the electromagnetic waves in the heating.

16. An etching method comprising:

etching a silicon-containing film or a metal-containing film formed on a substrate; and heating the substrate by temporarily irradiating the substrate with electromagnetic waves during the etching, wherein, in the etching, plasma is generated by applying a radio-frequency power so as to etch the silicon-containing film or the metal-containing film, and an application of the radio-frequency power is stopped during an irradiation period of the electromagnetic waves in the heating.

* * * * *